(12) United States Patent
Lee et al.

(10) Patent No.: US 7,468,530 B2
(45) Date of Patent: Dec. 23, 2008

(54) STRUCTURE AND METHOD FOR FAILURE ANALYSIS IN A SEMICONDUCTOR DEVICE

(75) Inventors: Ki-Am Lee, Yongin-si (KR); Sang-Deok Kwon, Seoul (KR); Jong-Hyun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 392 days.

(21) Appl. No.: 11/291,242

(22) Filed: Nov. 30, 2005

(65) Prior Publication Data
US 2006/0118784 A1 Jun. 8, 2006

(30) Foreign Application Priority Data
Dec. 7, 2004 (KR) .................. 10-2004-0102543

(51) Int. Cl.
*H01L 29/74* (2006.01)
(52) U.S. Cl. ............................... 257/207; 257/E21.521
(58) Field of Classification Search ................. 257/207, 257/E21.521
See application file for complete search history.

(56) References Cited

U.S. PATENT DOCUMENTS

| | | | |
|---|---|---|---|
| 5,444,012 A | 8/1995 | Yoshizumi et al. | |
| 5,937,290 A | 8/1999 | Sekiguchi et al. | |
| 2003/0034558 A1 | 2/2003 | Umemura et al. | ............ 257/734 |
| 2003/0122160 A1* | 7/2003 | Houston et al. | ............ 257/207 |
| 2004/0105327 A1 | 6/2004 | Tanno | ........................ 365/200 |

FOREIGN PATENT DOCUMENTS

| | | |
|---|---|---|
| JP | 07-037988 | 2/1995 |
| JP | 09-064122 | 3/1997 |
| JP | 09-321245 | 12/1997 |
| JP | 2003-133377 | 5/2003 |
| JP | 2004-178724 | 6/2004 |
| KR | 10-2003-0050651 | 6/2003 |
| KR | 10-2004-0047709 | 6/2004 |

* cited by examiner

*Primary Examiner*—Thao X Le
*Assistant Examiner*—Elias Ullah
(74) *Attorney, Agent, or Firm*—Mills & Onello LLP

(57) ABSTRACT

In a method and structure for semiconductor failure analysis, the structure comprises: a plurality of analytic fields disposed on a predetermined area of a semiconductor device; semiconductor transistors arranged in each of the analytic fields, the semiconductor transistors arranged in an array; wordlines arranged on each of the plurality of the analytic fields, connecting the semiconductor transistors with each other in a first direction; and bitline structures on each of the plurality of the analytic fields, connecting the semiconductor transistors with each other in a second direction, wherein the bitline structures are configured in different patterns in each of the plurality of analytic fields.

27 Claims, 18 Drawing Sheets

Fig. 9A

| ▲ | Over normal | First field (L2 structure) | | |
|---|---|---|---|---|
| ⊙ | Normal | Structure /Use | Processing margin | Defect probability |
| ▽ | Under normal | | | |
| Gate | | Wordline | ⊙ or ▲ | ⊙ or ▽ |
| Contact hole | | | ⊙ or ▲ | ⊙ or ▽ |
| Contact plug | | | ⊙ or ▲ | ⊙ or ▽ |
| First metal pattern | | Landing Pad | ⊙ or ▲ | ⊙ or ▽ |
| First via hole | | | ⊙ | ⊙ |
| First via plug | | | ⊙ | ⊙ |
| Second metal pattern | | Bit Line | ⊙ | ⊙ |

Fig. 9B

| ▲ | Over normal | Second field (L3 structure) | | |
|---|---|---|---|---|
| ⊙ | Normal | Structure /Use | Processing margin | Defect probability |
| ▽ | Under normal | | | |
| Gate | | Wordline | ⊙ or ▲ | ⊙ or ▽ |
| Contact hole | | | ⊙ or ▲ | ⊙ or ▽ |
| Contact plug | | | ⊙ or ▲ | ⊙ or ▽ |
| First metal pattern | | Landing Pad | ⊙ or ▲ | ⊙ or ▽ |
| First via hole | | | ⊙ or ▲ | ⊙ or ▽ |
| First via plug | | | ⊙ or ▲ | ⊙ or ▽ |
| Second metal pattern | | Landing Pad | ⊙ or ▲ | ⊙ or ▽ |
| Second via hole | | | ⊙ | ⊙ |
| Second via plug | | | ⊙ | ⊙ |
| Third metal pattern | | Bit Line | ⊙ | ⊙ |

Fig. 9C

| ▲ | Over normal | Third field (L4 structure) | | |
|---|---|---|---|---|
| ⊙ | Normal | Structure /Use | Processing margin | Defect probability |
| ▽ | Under normal | | | |
| Gate | | Wordline | ⊙ or ▲ | ⊙ or ▽ |
| Contact hole | | | ⊙ or ▲ | ⊙ or ▽ |
| Contact plug | | | ⊙ or ▲ | ⊙ or ▽ |
| First metal pattern | | Landing Pad | ⊙ or ▲ | ⊙ or ▽ |
| First via hole | | | ⊙ or ▲ | ⊙ or ▽ |
| First via plug | | | ⊙ or ▲ | ⊙ or ▽ |
| Second metal pattern | | Landing Pad | ⊙ or ▲ | ⊙ or ▽ |
| Second via hole | | | ⊙ or ▲ | ⊙ or ▽ |
| Second via plug | | | ⊙ or ▲ | ⊙ or ▽ |
| Third metal pattern | | Landing Pad | ⊙ or ▲ | ⊙ or ▽ |
| Third via hole | | | ⊙ | ⊙ |
| Third via plug | | | ⊙ | ⊙ |
| Fourth metal pattern | | Bit Line | ⊙ | ⊙ |

Fig. 9D

| ▲ | Over normal | Fourth field (L5 structure) | | |
|---|---|---|---|---|
| ⊙ | Normal | Structure /Use | Processing margin | Defect probability |
| ▽ | Under normal | | | |
| Gate | | Wordline | ⊙ or ▲ | ⊙ or ▽ |
| Contact hole | | | ⊙ or ▲ | ⊙ or ▽ |
| Contact plug | | | ⊙ or ▲ | ⊙ or ▽ |
| First metal pattern | | Landing Pad | ⊙ or ▲ | ⊙ or ▽ |
| First via hole | | | ⊙ or ▲ | ⊙ or ▽ |
| First via plug | | | ⊙ or ▲ | ⊙ or ▽ |
| Second metal pattern | | Landing Pad | ⊙ or ▲ | ⊙ or ▽ |
| Second via hole | | | ⊙ or ▲ | ⊙ or ▽ |
| Second via plug | | | ⊙ or ▲ | ⊙ or ▽ |
| Third metal pattern | | Landing Pad | ⊙ or ▲ | ⊙ or ▽ |
| Third via hole | | | ⊙ or ▲ | ⊙ or ▽ |
| Third via plug | | | ⊙ or ▲ | ⊙ or ▽ |
| Fourth metal pattern | | Landing Pad | ⊙ or ▲ | ⊙ or ▽ |
| Fourth via hole | | | ⊙ | ⊙ |
| Fourth via plug | | | ⊙ | ⊙ |
| Fifth metal pattern | | Bit Line | ⊙ | ⊙ |

STRUCTURE AND METHOD FOR FAILURE ANALYSIS IN A SEMICONDUCTOR DEVICE

CROSS-REFERENCE TO RELATED APPLICATIONS

This U.S. non-provisional patent application claims priority under 35 U.S.C. § 119 of Korean Patent Application 2004-102543 filed on Dec. 7, 2004, the entire contents of which are hereby incorporated by reference.

BACKGROUND

The present invention is concerned with failure analysis for semiconductor devices, which in more particular relates to a structure and method for failure analysis. For mass production of semiconductor devices, reliable processing technologies capable of offering payable yields are desired. Procedures for improving the reliability and stability of processing technologies include the steps of designing semiconductor devices, manufacturing samples of the semiconductor devices, and testing the samples. Failure analysis of semiconductor devices is a feedback procedure that involves locating and curing the sources of defects so as to overcome the problems that may arise from the defects.

The strategy of designing and fabricating a semiconductor device can be highly intertwined with failure analysis results. Therefore, an appropriate failure analysis is critical in improving semiconductor device qualities. Incorrect failure analysis can lengthen the term required for developing and advancing semiconductor device products. Thus, fast and accurate failure analysis is highly important in reducing the development term in bringing a semiconductor device to market.

In general, semiconductor wafers contain test patterns, which are formed with various design rules, in purpose of effectively analyzing failure substantials. Varieties of electrical measurements carried on the test patterns are utilized to evaluate structural and electrical characteristics of various microscopic architecture forming electronic circuits in semiconductor devices. For this, the test patterns are designed to monitor structural/electrical characteristics of elements constituting semiconductor devices.

A process for manufacturing a semiconductor device may be divided into the front-end process including steps taken prior to transistor formation, and the back-end process including steps following transistor formation. The back-end process includes a step of forming an interconnection structure to connect the transistors with each other, and a step of forming an interlevel insulation film in order to mechanically support and to electrically insulate the interconnection structure. U.S. Patent US2003-034558, to Eiichi Umemura et al., discloses a technique for treating a test pattern with a contact chain structure in order to evaluate the performance of the back-end process. While such a technique is capable of finding interconnection-type defects (i.e., short circuits or open circuits), it is impossible to obtain detailed information about the types and positions of the defects.

When accurate positions of certain defects are known, semiconductor substrates at the defect positions may be precisely cut out by means of a focused ion beam (FIB) and the sections thereof may be enlarged to a dimension that is suitable for inspection by a scanning electron microscope (SEM). However, since no information about the defect positions is available, a large number of wafer-cutting processes are required to obtain optical features with enlarged sections for analysis by inspection. In other words, if defective locations are included in the sections obtained by the wafer-cutting processes, the defects may be enlarged into a dimension capable of being inspected by the SEM. Otherwise, without the availability of any information related to the location of the defective locations, there is no assurance of inclusion with the defective locations in sections obtained by the wafer-cutting processes. As a result, many wafer-cutting processes are required. Specifically, in the case of analyzing semiconductor devices having defects in a restricted number, a test wafer would be damaged to such a degree by wafer cutting operations that failure analysis is rendered impossible. Consequently, development delays can result due to lack of determination of reasons for failure.

SUMMARY OF THE INVENTION

Pursuant to embodiments of the invention, there is provided a structure for failure analysis to evaluate defects arising from a back-end process in manufacturing a semiconductor device.

Pursuant to some embodiments of the invention, there is provided a structure for failure analysis to correctly find defective spots arising from a back-end process in manufacturing a semiconductor device.

Pursuant to further embodiments of the invention, there is provided a structure for failure analysis to readily determine the types of defects arising from manufacturing a semiconductor device having a multi-level interconnection structure.

Pursuant to still further embodiments of the invention, there is provided a structure for failure analysis to readily determine vertical positions of interconnection defects arising from manufacturing a semiconductor device having a multi-level interconnection structure.

Pursuant to still further embodiments of the invention, there is provided a method for failure analysis to evaluate defects arising from a back-end process in manufacturing a semiconductor device.

Pursuant to still further embodiments of the present invention, there is provided a structure for failure analysis to readily determine topological positions and types of defects arising from a back-end process in manufacturing a semiconductor device.

In one aspect, the present invention is directed to an analytic structure for semiconductor failure analysis, comprising: a plurality of analytic fields disposed on a predetermined area of a semiconductor device; semiconductor transistors arranged in each of the analytic fields, the semiconductor transistors arranged in an array; wordlines arranged on each of the plurality of the analytic fields, connecting the semiconductor transistors with each other in a first direction; and bitline structures on each of the plurality of the analytic fields, connecting the semiconductor transistors with each other in a second direction, wherein the bitline structures are configured in different patterns in each of the plurality of analytic fields.

In one embodiment, the semiconductor transistors constitute an SRAM cell array including two load transistors, two drive transistors, and two pass transistors.

In another embodiment, the wordlines connect gate electrodes of the pass transistors with each other in a first direction, wherein the bitline structures connect drain regions of the pass transistors with each other in a second direction.

In another embodiment, the bitline structures at least comprise metal patterns of a single layer and plugs of a single layer.

In another embodiment, the metal patterns and plugs of the bitline structures are formed in a number of layers that is different in each of the plurality of analytic fields.

In another embodiment, the metal patterns and plugs of the bitline structures are formed in a configuration that is different in each of the plurality of analytic fields.

In another aspect, the present invention is directed to an analytic structure for semiconductor failure analysis, comprising: analytic fields disposed on a predetermined area of a semiconductor device, at least including first, second, third, and fourth analytic fields; semiconductor transistors arranged in each of the analytic fields, the semiconductor transistors arranged in an array; wordlines arranged on each of the plurality of analytic fields, connecting the semiconductor transistors with each other in a first direction; and bitline structures on each of the plurality of analytic fields, connecting the semiconductor transistors with each other in a second direction, wherein the bitline structures comprises metal patterns and plugs that are different in a number of layers and in interconnection features in each of the plurality of the analytic fields.

In one embodiment, the semiconductor transistors constitute an SRAM cell array including two load transistors, two drive transistors, and two pass transistors.

In another embodiment, the wordlines connect gate electrodes of the pass transistors with each other in the first direction, wherein the bitline structures connect drain regions of the pass transistors with each other in the second direction.

In another embodiment, the bitline structures comprise: contact plugs connected to drain regions of the semiconductor transistors; first metal patterns contacting to the contact plugs; first via plugs contacting to the first metal patterns; and second metal patterns contacting to the first via plugs, wherein the first metal patterns are pads electrically connected to one of the contact plugs.

In another embodiment, the second metal patterns connect the first via plugs with each other in the second direction in the first analytic field, and are disposed to be electrically connected to one of the drain regions through one of the via plugs in a remainder of the analytic fields including the second through fourth fields.

In another embodiment, the bitline structures further comprise: second via plugs connected to the second metal patterns in a remainder of the analytic fields except the first field; third metal patterns connected to the second via plugs; third via plugs connected to the third metal patterns in the remainder of the analytic fields except the first and second fields; fourth metal patterns connected to the third via plugs; fourth via plugs connected to the fourth metal patterns in the remainder of the analytic fields except the first through third fields; and fifth metal patterns connected to the fourth via plugs, wherein the third metal patterns connect the second via plugs with each other in the second direction in the second field, and are disposed to be electrically connected to one of the drain regions through the second via plugs in the remainder of the analytic fields including the third and fourth fields, wherein the fourth metal patterns connect the third via plugs with each other in the second direction in the third field, and are disposed to be electrically connected to one of the drain regions through the third via plugs in the remainder of the analytic fields including the fourth fields, wherein the fifth metal patterns connect the second via plugs with each other in the second direction in the fourth field.

In another embodiment, the third metal patterns are larger than the first metal patterns in area in the remainder of the analytic fields except the first and second fields.

In another embodiment, the third via plugs are positioned vertically on the second via plugs to form a stacked via structure in the remainder of the analytic fields except the first and second fields.

In another embodiment, the third via plugs are positioned on the third metal pattern in plurality to form a multi-via structure in the remainder of the analytic fields except the first and second fields.

In another embodiment, the fourth metal patterns are larger than the first metal patterns in area in the remainder of the analytic fields except the first through third fields.

In another embodiment, the fourth via plugs are positioned vertically on the second or third via plugs to form a stacked via structure in the remainder of the analytic fields except the first through third fields.

In another embodiment, the fourth via plugs are positioned on the fourth metal pattern in plurality to form a multi-via structure in the remainder of the analytic fields except the first through third fields.

In another aspect, the present invention is directed to a method for failure analysis in a semiconductor device, comprising the steps of: forming an analytic structure that includes a plurality of analytic fields, semiconductor transistors arranged in an array structure in each of the analytic fields, and wordline and bitline structures connecting the semiconductor transistors in first and second directions respectively; performing a test on the analytic structure to generate a test result; evaluating defects that arise from forming the analytic structure, with reference to the test result, wherein evaluating includes analyzing addresses of the wordline and bitline structures having defects so as to determine plane positions of the defects.

In one embodiment, the bitline structure comprises metal patterns of at least a single layer and plugs of at least a single layer, wherein the metal patterns and plugs are formed in a number of layers and in an architecture type that is different in each of the analytic fields.

In another embodiment, the evaluating step comprises analyzing locations of the analytic fields having the defects or analyzing a type of the defects so as to determine vertical positions of the defects, wherein determining the vertical positions utilizes the difference of the layer numbers and architecture type of the metal patterns and plugs in accordance with the locations of the analytic fields.

In another embodiment, the step of forming the analytic structure comprises fabricating a semiconductor device in a predetermined region under a design rule, wherein the semiconductor device includes interconnections and interconnection plugs in the same layer numbers with the metal patterns and plugs associated with the bitline structure.

In another embodiment, the interconnections and interconnection plugs are formed by using processes of forming the metal patterns and plugs, wherein the metal patterns and plugs are formed under the same design rule with the interconnections and interconnection plugs.

In another embodiment, the semiconductor transistors are configured to constitute an SRAM cell array including two load transistors, two drive transistors, and two pass transistors.

In another embodiment, the wordlines are configured to connect gate electrodes of the pass transistors with each other in the first direction, wherein the bitline structures are configured to connect drain regions of the pass transistors with each other in the second direction.

In another aspect, the present invention is directed to a method for failure analysis in a semiconductor device, comprising the steps of: forming an analytic structure that includes analytic fields comprising first, second, third and fourth analytic fields, semiconductor transistors arranged in an array structure in each of the analytic fields, and wordline and bitline structures connecting the semiconductor transistors in first and second directions respectively; performing a test on the analytic structure to generate test results; evaluating defects that arise from forming the analytic structure, with reference to the test results, wherein evaluating includes analyzing addresses of the wordline and bitline structures having defects so as to determine plane positions of the defects.

In one embodiment, the bitline structure comprises metal patterns of at least a single layer and plugs of at least a single layer, wherein the metal patterns and plugs are formed in a number of layers and in an architecture that is different in each of the analytic fields.

In another embodiment, the evaluating step comprises analyzing locations of the analytic fields having the defects or analyzing a type of the defects so as to determine vertical positions of the defects, wherein determining the vertical positions utilizes the difference of the layer numbers and architecture type of the metal patterns and plugs in accordance with the locations of the analytic fields.

In another embodiment, the semiconductor transistors are configured to constitute an SRAM cell array including two load transistors, two drive transistors, and two pass transistors.

In another embodiment, the wordlines are configured to connect gate electrodes of the pass transistors with each other in a first direction, wherein the bitline structures are configured to connect drain regions of the pass transistors with each other in a second direction.

In another embodiment, forming the bitline structure comprises: forming contact plugs connected to drain regions of the semiconductor transistors; forming first metal patterns contacting to the contact plugs; forming first via plugs contacting to the first metal patterns; and forming second metal patterns contacting to the first via plugs, wherein the first metal patterns are pads electrically connected to one of the contact plugs.

In another embodiment, the second metal patterns are formed to connect the first via plugs with each other in the second direction in the first analytic field, and are disposed to be electrically connected to one of the drain regions through one of the via plugs in a remainder of the analytic fields including the second through fourth fields.

In another embodiment, forming the bitline structures further comprises: forming second via plugs connected to the second metal patterns in a remainder of the analytic fields except the first field; forming third metal patterns connected to the second via plugs; forming third via plugs connected to the third metal patterns in the remainder of the analytic fields except the first and second fields; forming fourth metal patterns connected to the third via plugs; forming fourth via plugs connected to the fourth metal patterns in the remainder of the analytic fields except the first through third fields; and forming fifth metal patterns connected to the fourth via plugs.

In another embodiment, the third metal patterns connect the second via plugs with each other in the second direction in the second field, and are disposed to be electrically connected to one of the drain regions through the second via plugs in the remainder of the analytic fields including the third and fourth fields; wherein the fourth metal patterns connect the third via plugs with each other in the second direction in the third field, and are disposed to be electrically connected to one of the drain regions through the third via plugs in the remainder of the analytic fields including the fourth fields; and wherein the fifth metal patterns connect the second via plugs with each other in the second direction in the fourth field.

In another embodiment, the third metal patterns are larger than the first metal patterns in area in the remainder of the analytic fields except the first and second fields.

In another embodiment, the third via plugs are positioned vertically on the second via plugs to form a stacked via structure in the remainder of the analytic fields except the first and second fields.

In another embodiment, the third via plugs are positioned on the third metal pattern in plurality to form a multi-via structure in the remainder of the analytic fields except the first and second fields.

In another embodiment, the fourth metal patterns are larger than the first metal patterns in area in the remainder of the analytic fields except the first through third fields.

In another embodiment, the fourth via plugs are positioned vertically on the second or third via plugs to form a stacked via structure in the remainder of the analytic fields except the first through third fields.

In another embodiment, the fourth via plugs are positioned on the fourth metal pattern in plurality to form a multi-via structure in the remainder of the analytic fields except the first through third fields.

In another embodiment, the step of forming the analytic structure comprises fabricating a semiconductor device in a predetermined region of the semiconductor substrate under a design rule, wherein the semiconductor device includes interconnections and interconnection plugs in the same layer numbers with the metal patterns and plugs associated with the bitline structure.

In another embodiment, the step of forming the analytic structure comprises fabricating a semiconductor device in a predetermined region of the semiconductor substrate under a design rule, wherein the semiconductor device includes first through fifth interconnections and first through fourth interconnection plugs that are provided by using processes of forming the first through fifth metal patterns and the first through fourth plugs associated with the bitline structure.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings:

FIGS. 2A through 7A are top views showing processing steps for fabricating an analytic structure in accordance with an embodiment of the invention;

FIGS. 2B through 7B are sectional views taken along section line I-I' of FIGS. 2A through 7A, respectively;

FIGS. 2C through 7C are sectional views taken along section line II-II' of FIGS. 2A through 7A, respectively;

FIGS. 9A through 9D are table charts showing processing margins adaptable to processing steps in fabricating the analytic structure according to the embodiment of the invention.

DETAILED DESCRIPTION OF PREFERRED EMBODIMENTS

Figure 1:
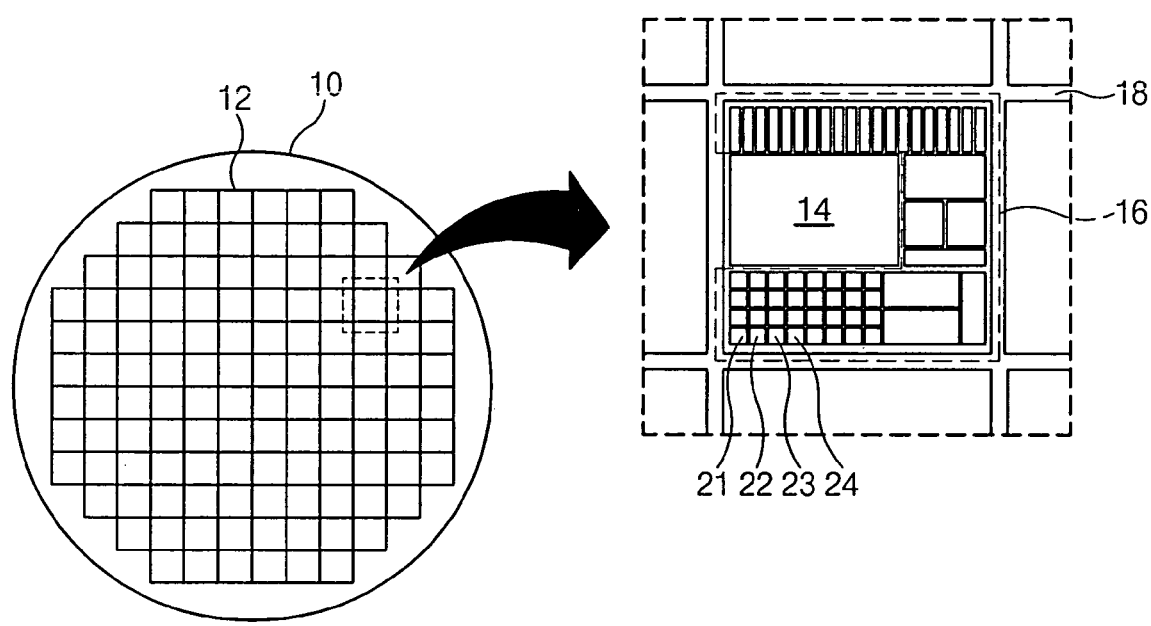
FIG. 1 is a top view illustrating an analytic structure according to the invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete.

In the drawings, the thickness of layers and regions are exaggerated for clarity. It will also be understood that when a layer is referred to as being "on" another layer or substrate, it can be directly on the other layer or substrate, or intervening layers may also be present. Like numerals refer to like elements throughout the specification.

FIG. 1 is a top view illustrating an analytic structure according to the invention.

Referring to FIG. 1, pluralities of dies 12 are disposed on a semiconductor wafer 10, being comprised of a product region 14 and subsidiary regions 16. The dies 12 are segmented by means of a wafer-sawing process, each providing a semiconductor chip product. The product region 14 is to be used as the semiconductor chip product, and the subsidiary region 16 embeds analytic structures therein to evaluate the pertinency of the manufacturing process. The area of the subsidiary region 16 decreases during different stages of development. Especially, in the stage of mass production, the subsidiary regions 16 may be disposed in cutting regions 18 between the dies 12, as well as on the dies 12.

The analytic structures may include test patterns formed by various design rules so as to determine processing steps, thereby ensuring stability in manufacturing a semiconductor device. In more detail, the analytic structures are classified into front-end analytic structures for evaluating the processing stability in manufacturing transistors, and back-end analytic structures for evaluating the processing stability in processing fabrication steps (e.g., a interconnection forming process) after forming the transistors.

The front-end analytic structures may be comprised of transistors that are constructed in variously modified patterns. By conducting electrical test operations for the front-end analytic structures with various items, it is able to optimize the processing conditions for manufacturing the transistors.

As also, the back-end analytic structures may be comprised of transistors that are constructed in variously modified patterns. By conducting electrical test operations for the back-end analytic structures with various items, it is able to optimize the processing conditions for manufacturing the interconnection structures. The interconnection structures are generally composed of contact plugs, via plugs, metal patterns, and metal lines. Accordingly, the test operations for the back-end analytic structures assist in determining defective factors arising from the processes of forming and patterning interlevel insulation films, filing with conductive plug films, and forming and patterning metal films.

In the invention, the interconnection structures are arranged to connect the transistors in an arrayed architecture with each other for the purpose of readily analyzing defects that occur in the interconnection structures. As will be described hereinbelow in detail, the transistor array is helpful for determining plane positions (i.e., the position where cells with defects are located) without difficulty. Further, the analytic structures are configured to enable each portion of the interconnection structures to be testable independently. For the independent test operations, the invention is embodied with pluralities of interconnection structures having respectively different types of construction. As also will be described hereinafter in detail, the interconnection structures with different architectures are helpful for the ready analysis of the vertical positions of defects (i.e., the positions where layers with defects are located) without difficulty. According to certain embodiments of the invention, the interconnection structures are each disposed at different subsidiary regions.

FIGS. 2A through 7A are top views showing processing steps for fabricating an analytic structure in accordance with an embodiment of the invention. FIGS. 2B through 7B are sectional views taken along section line I-I' of FIGS. 2A through 7A, respectively, and FIGS. 2C through 7C are sectional views taken along section line II-II' of FIGS. 2A through 7A, respectively. FIG. 3D is a sectional view taken along section line III-III' of FIG. 3A.

According to the invention, a single die includes pluralities of analytic structures those are different from each other in the number of layers and in architecture. In detail, the following embodiments include back-end analytic structures with first, second, third, fourth, and fifth metal layers, in which four analytic structures with different layer numbers and architecture, i.e., first, second, third, and fourth analytic fields, 21, 22, 23, and 24, are disposed on a single die (see FIG. 1). The number and structures of analytic fields are variable in accordance with the number of metal layers forming the semiconductor device. According to this embodiment, the first analytic field is configured to determine defects that arise from formation of the first and second metal layers. The second analytic field is configured to determine defects that arise from formation of the third metal layer and the third analytic field is configured to determine defects that arise from formation of the fourth metal layer. The fourth analytic field is configured to determine defects that arise from formation of the fifth metal layer. The structural features can vary according to application, and are not limited to the embodiments disclosed herein.

FIGS. 2A, 2B, 2C, 3A, 3B, and 3C illustrate processing steps of forming transistor structures and metal patterns, the transistor structure being formed in the same configuration in all of the four analytic fields 21, 22, 23, and 24.

Figure 2A:
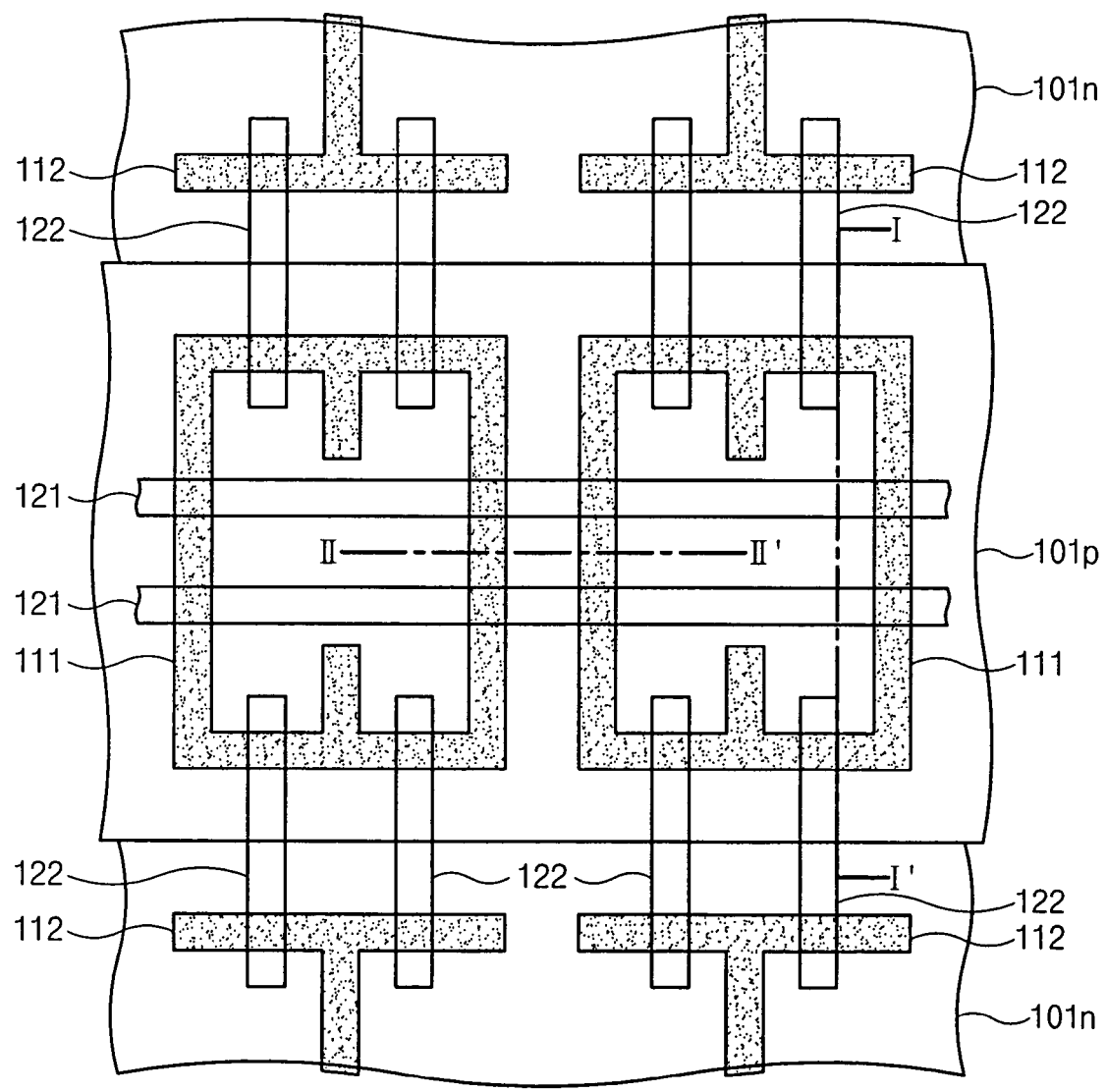
Figure 2B:
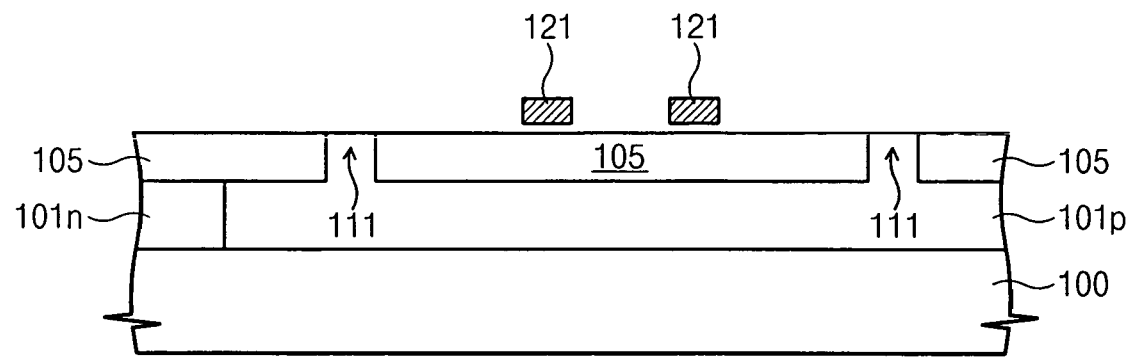
Figure 2C:
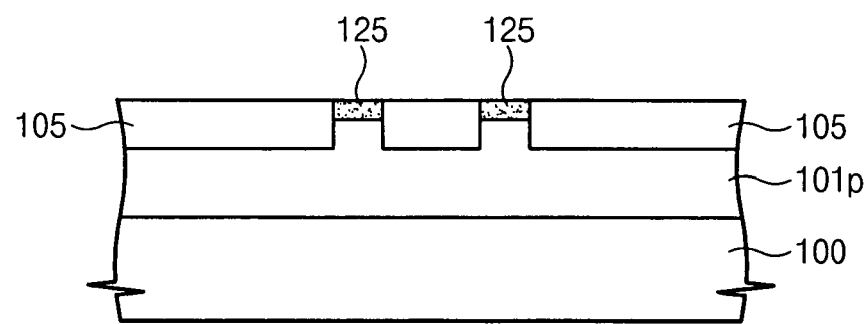
Figure 8:
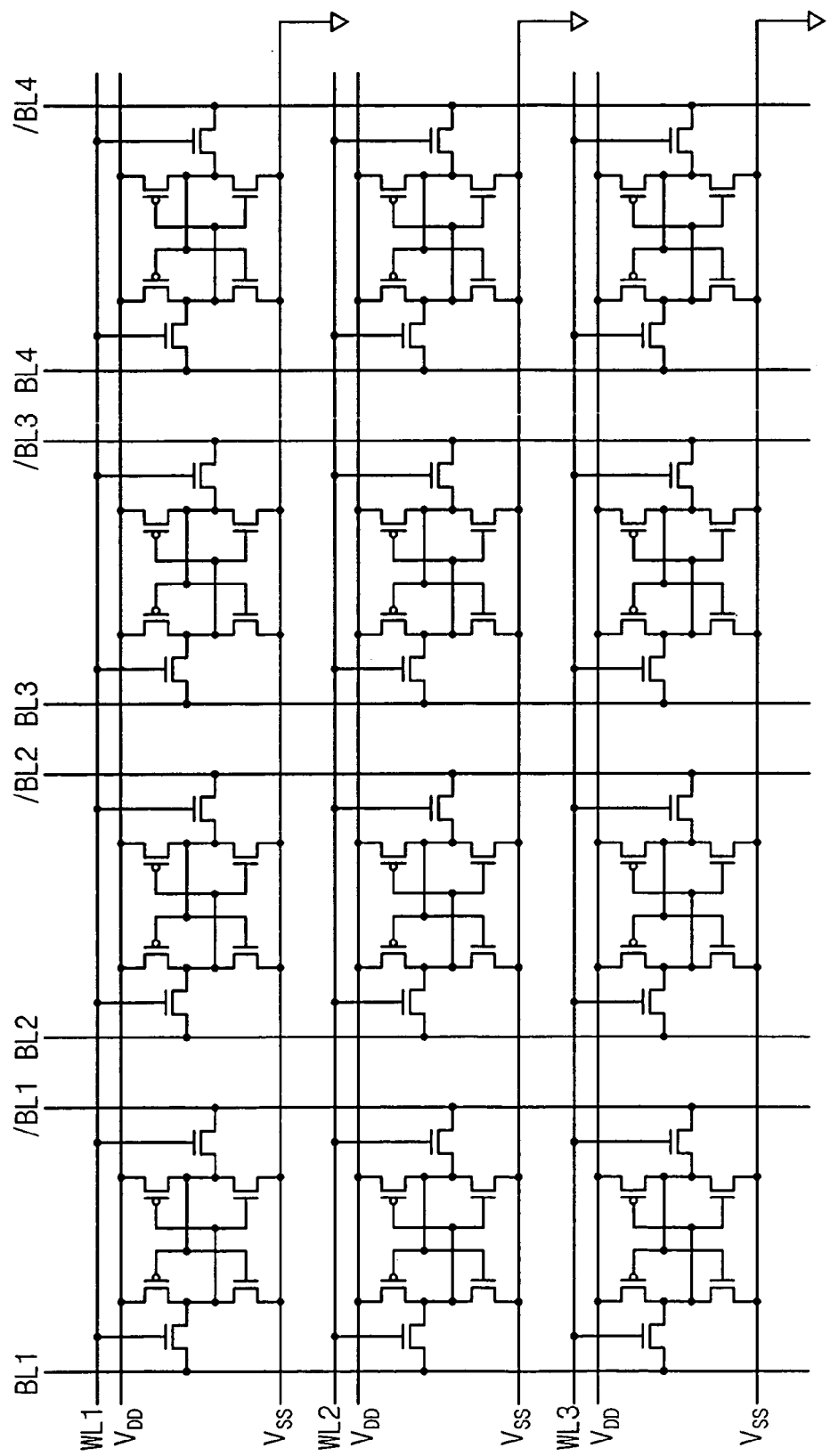
FIG. 8 is a circuit diagram of a general SRAM cell array.

Referring to FIGS. 2A, 2B, and 2C, the analytic structure by the invention is comprised of CMOS SRAM cells formed in an array architecture in a semiconductor substrate 100 (see FIG. 8). Each CMOS SRAM cell is composed of a pair of drive transistors, a pair of pass transistors, and a pair of load transistors.

In the semiconductor substrate 100, field isolation films 105 are formed to confine first and second active regions 111 and 112. The field isolation films 105 may be formed by means of a commonly known field isolation technique such as trench isolation. In one embodiment, the first active regions 111 may be shaped in a closed belt having four corners and the second active regions 112 may be patterned in shape of the English character "H". The field isolation films 105 are disposed within the first active regions 111, as well as between the first and second active regions 111 and 112.

The drive and pass transistors are disposed in first active regions 111 while the load transistors are disposed in the second active regions 112. The pass transistors use a first gate pattern 121, which is arranged to intersect pluralities of cells, as their gate electrodes. The first gate pattern 121 is used as a wordline in the CMOS SRAM cell array. For this, a plurality of the first gate pattern 121 are arranged to cross over the first active regions 111 in plural CMOS SRAM cells.

The drive transistors employ a second gate pattern 122 as their gate electrodes. The second gate pattern 122 is also used as gate electrodes of the load transistors. Namely, the second gate pattern 122 is commonly used for the gate electrodes of the drive and load transistors, for which it is arranged to cross over the first and second active regions 111 and 112.

In the first and second active regions 111 and 112 at both sides of the first and second gate patterns 121 and 122, impurity regions 125 are arranged to be used as source/drain regions of the pass and load transistors. The first active region 111 contains a P-type well 101p while the second active region 112 contains an N-type well 101n. The impurity regions 125 are formed to have N-type conductivity in the first active region 111, while they are formed to have P-type conductivity in the second active regions 112. As a result, the drive and pass transistors are NMOS transistors while the load transistors are PMOS transistors.

Figure 3A:
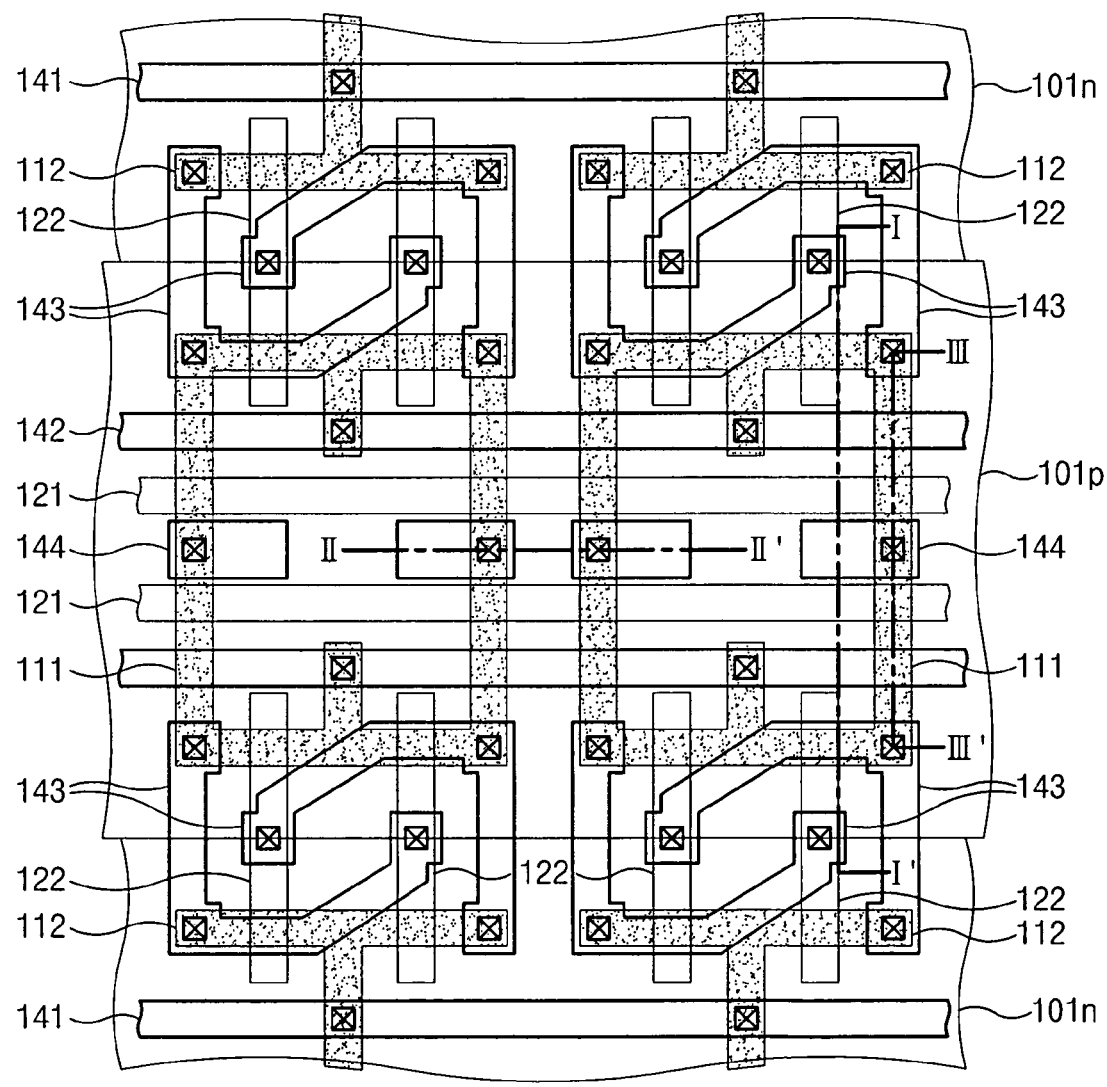
Figure 3B:
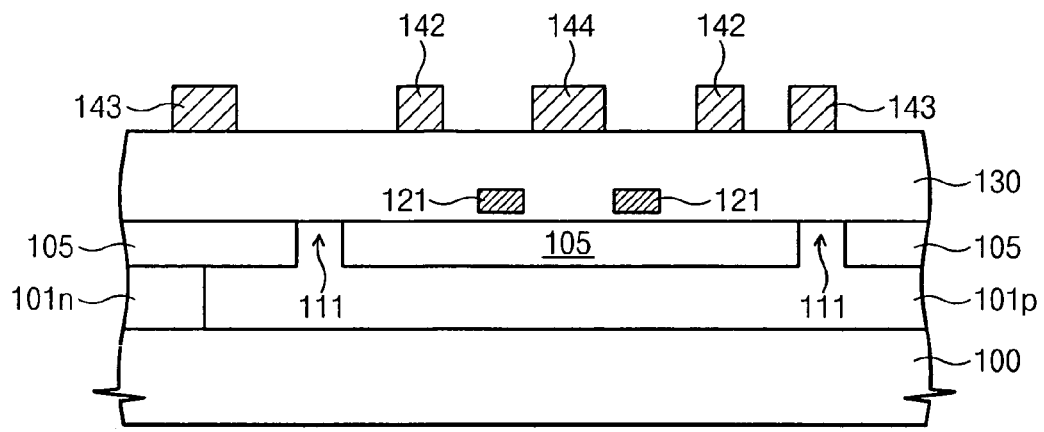
Figure 3C:
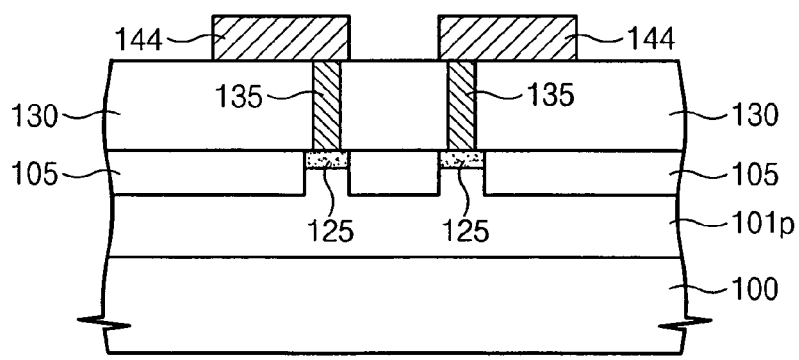
Figure 3D:
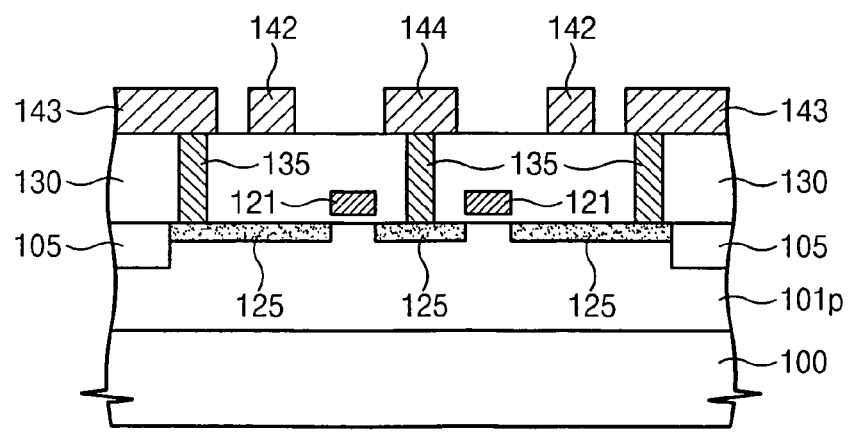
FIG. 3D is a sectional view taken along section line III-III' of FIG. 3A.

Referring to FIGS. 3A, 3B, and 3C, a first interlevel insulation film 130 is deposited on the resultant structure including the drive, pass, and load transistors. And then, contact plugs 135 are formed to connect with the top surfaces of the impurity regions 125, penetrating the first interlevel insulation film 130.

On the interlevel insulation film 130, first metal patterns are formed to connect the contact plugs 135. The first metal patterns are used for power source voltage (VDD) lines 141, ground voltage (VSS) lines 142, local interconnections 143, and first pads 144. The VDD lines 141 cross over the centers of the second active regions 112, being electrically connected to the impurity regions 125 of the load transistors. The VSS lines 142 cross over the first active regions 111, being electrically connected to the source regions 125 of the drive transistors interposed between the second gate patterns 122. The local interconnections 143 connect the second gate patterns 122 with the impurity regions 125 of the drive and load transistors in order to constitute a pair of inverters by the pairs of drive and load transistors. The first pads 144 are connected to the impurity regions 125 of the pass transistors through the contact plugs 135 disposed between the first gate patterns 121.

According to the embodiment by the invention, a second interlevel insulation film 150, a third interlevel insulation film 170, a fourth interlevel insulation film 190, and a fifth interlevel insulation film 150 are deposited on the resultant structure including the first metal patterns, 141, 142, 143, and 144, in sequence. The interlevel insulation films 130, 150, 170, 190, and 210 may be formed of silicon oxides or low-dielectric (or low-k) films.

Second metal patterns, 161, 162, 163, and 164, are formed on the second interlevel insulation film 150. Third metal patterns, 182, 183, 183', and 184, are formed on the third interlevel insulation film 170. Fourth metal patterns, 203, 204, and 204', are formed on the fourth interlevel insulation film 190. Fifth metal patterns 224 are formed on the fifth interlevel insulation film 210. The second metal patterns, 161, 162, 163, and 164, are connected to first via plugs 155 that penetrate the second interlevel insulation film 150, and the third metal patterns, 182, 183, 183', and 184, are connected to second via plugs 175 penetrating the third interlevel insulation film 170. The fourth metal patterns, 203, 204, and 204', are connected to third via plugs 195 that penetrate the fourth interlevel insulation film 190, and the fifth metal patterns 224 are connected to fifth via plugs 215 penetrating the fifth interlevel insulation film 210. The first through fourth via plugs, 155, 175, 195, and 215, are connected to the top surfaces of the first through fourth metal patterns, respectively. The metal patterns and via plugs may be formed of a material among tungsten (W), aluminum (Al), titanium nitride (TiN), titanium (Ti), tungsten nitride (WN), tantalum (Ta), tantalum nitride (TaN), and polysilicon.

Meanwhile, the full-CMOS SRAM cell transistors are usually fabricated with large processing margins. The processing margins thereof mean the marginal rates for processing conditions capable of preventing defects in each unit step of manufacturing. If the processing margin is made larger, the defect generation is minimized. To the contrary, if the processing margin is made smaller, the occurrence of defects is more increased. While there are many ways available for increasing the processing margin, a most preferred one to increase the design rule. In other words, technical difficulties in the processes of photolithography, etching, and deposition may be simply overcome by enlarging the width or area of a given pattern.

As aforementioned, if the cell transistors are formed using relatively large processing margins, defects arising from their manufacturing processes will be mitigated. Therefore, defects appearing in the analytic fields 21, 22, 23, 24 may be regarded as those arising from the formation of interconnections provided to connect the regions, and not from the formation of the cell transistors themselves.

Figure 4A:
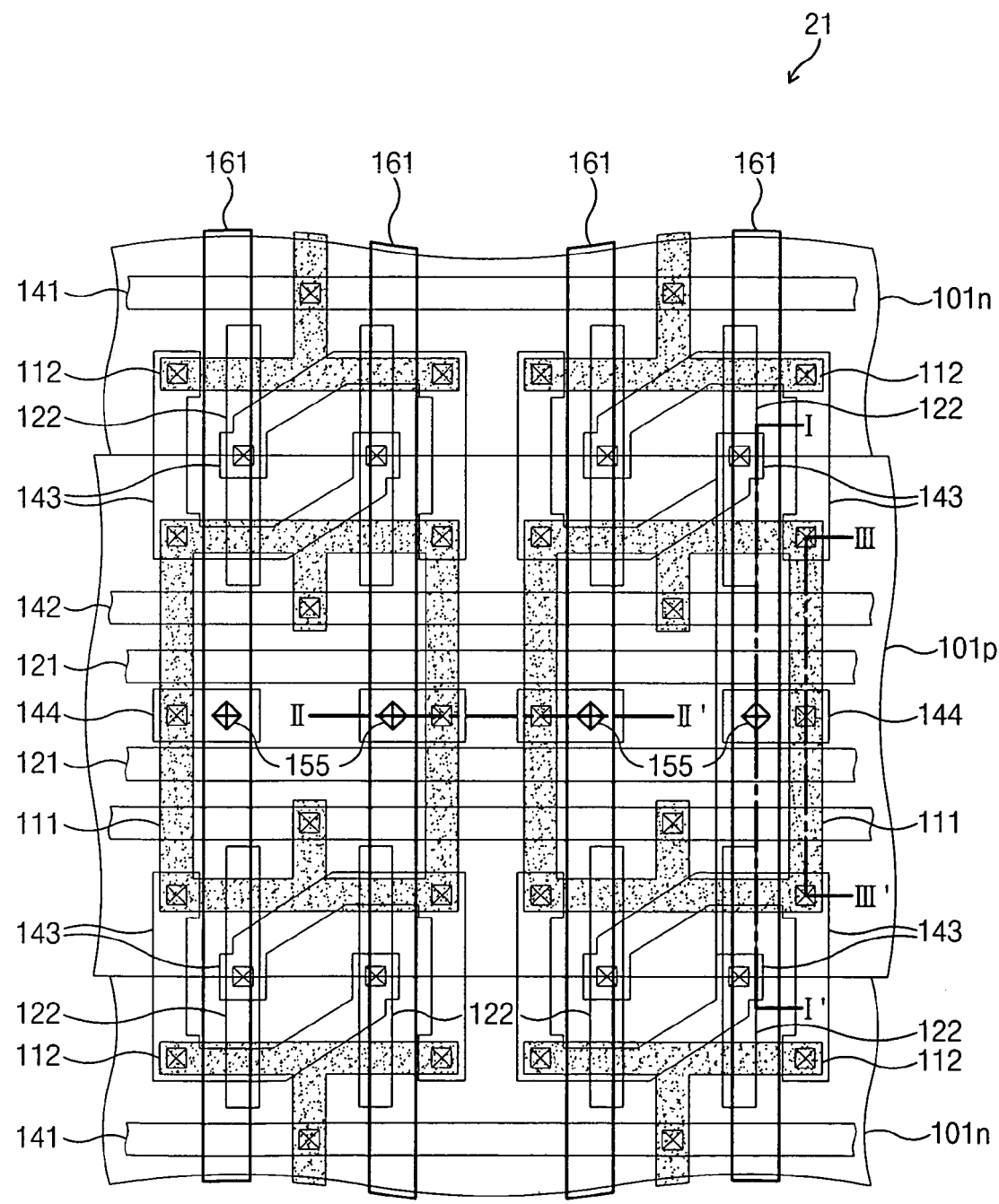
Figure 4B:
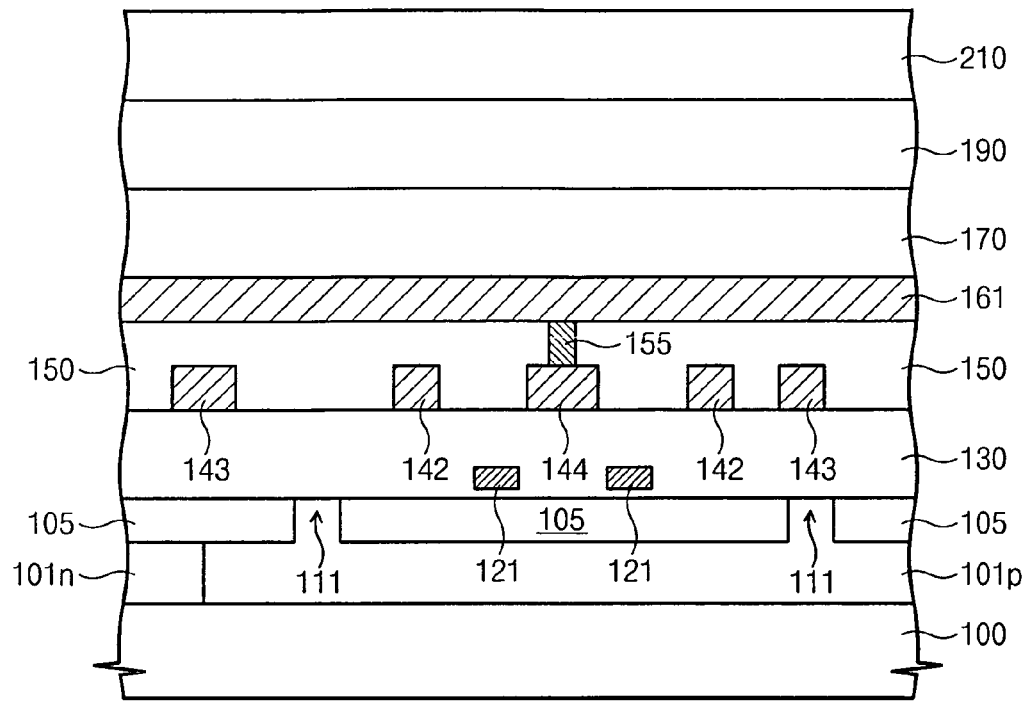
Figure 4C:
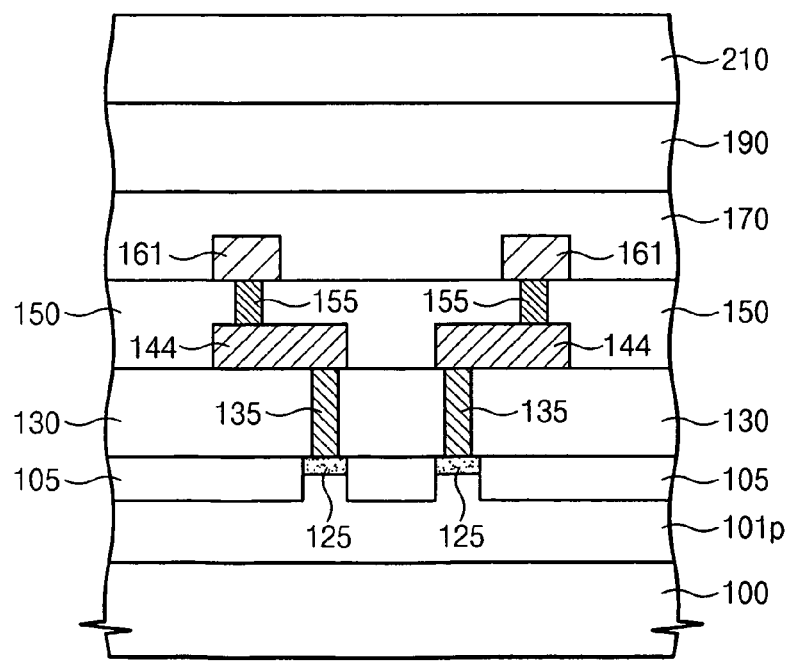

FIGS. 4A, 4B, and 4C illustrate the configuration of the first analytic field 21 being comprised of a typical bitline structure of the full-CMOS SRAM cell array. Referring to FIGS. 4A, 4B, and 4C, the second metal patterns 161 disposed on the first analytic field 21 are connected to the impurity regions 125 of the pass transistors by way of the first via plugs 155, the first pads 144, and the contact plugs 135. As a result, the second metal patterns 161 form bitlines that connect the SRAM cells (i.e., the pass transistors in detail) lengthwise. Thus, the first analytic region 21 does not further require the third, fourth, and fifth metal patterns.

According to this embodiment of the invention, the second metal patterns 161 and the first via plugs 155 in the first analytic field 21 are formed with normal processing margins (see FIG. 9A). In this case, as the cell transistors are fabricated with large processing margins, it is highly possible that any defects appearing at the first analytic field 21 would be generated as a result of the process of forming the second metal patterns, the first via holes, or the first via plugs.

Figure 5A:
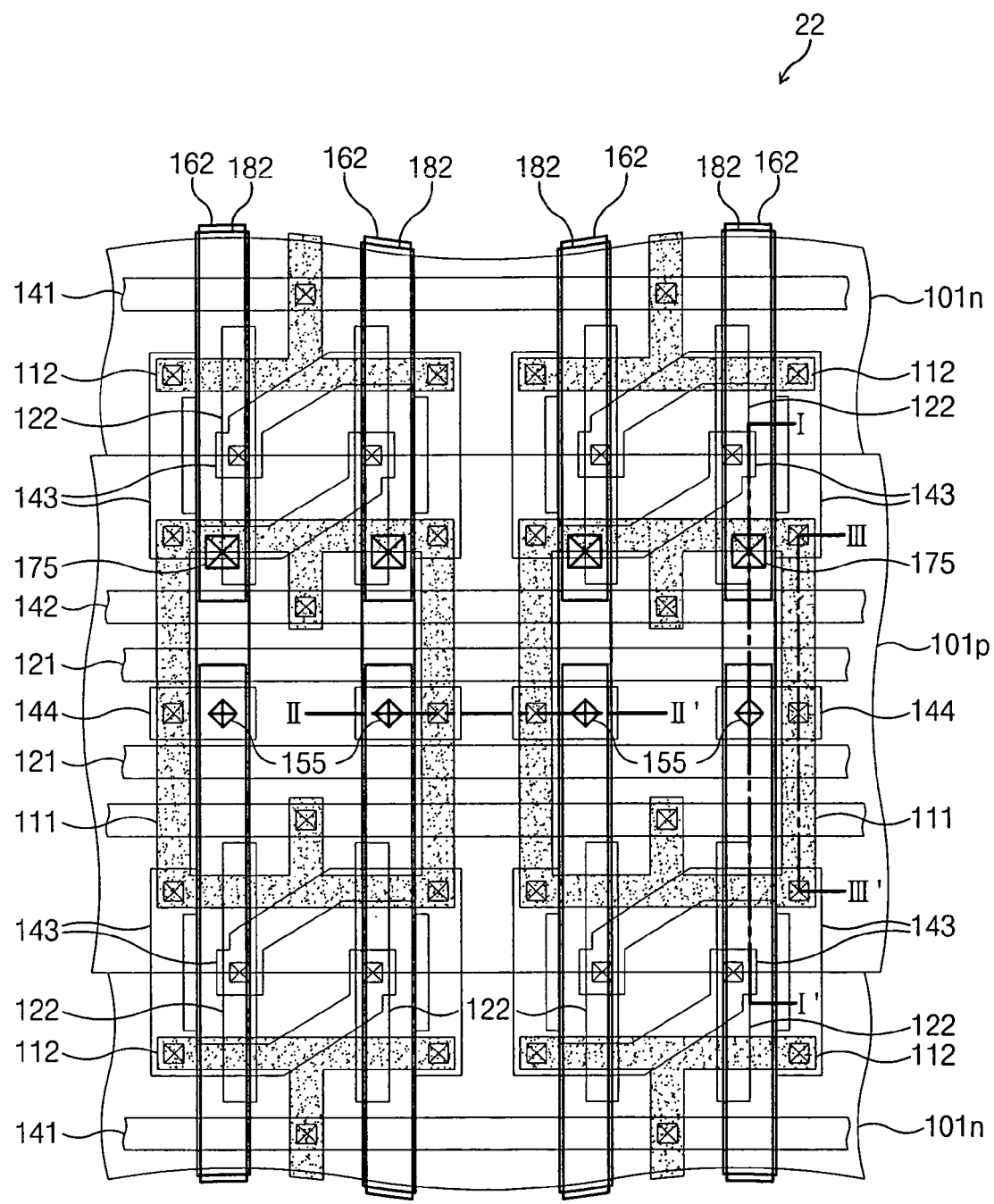
Figure 5B:
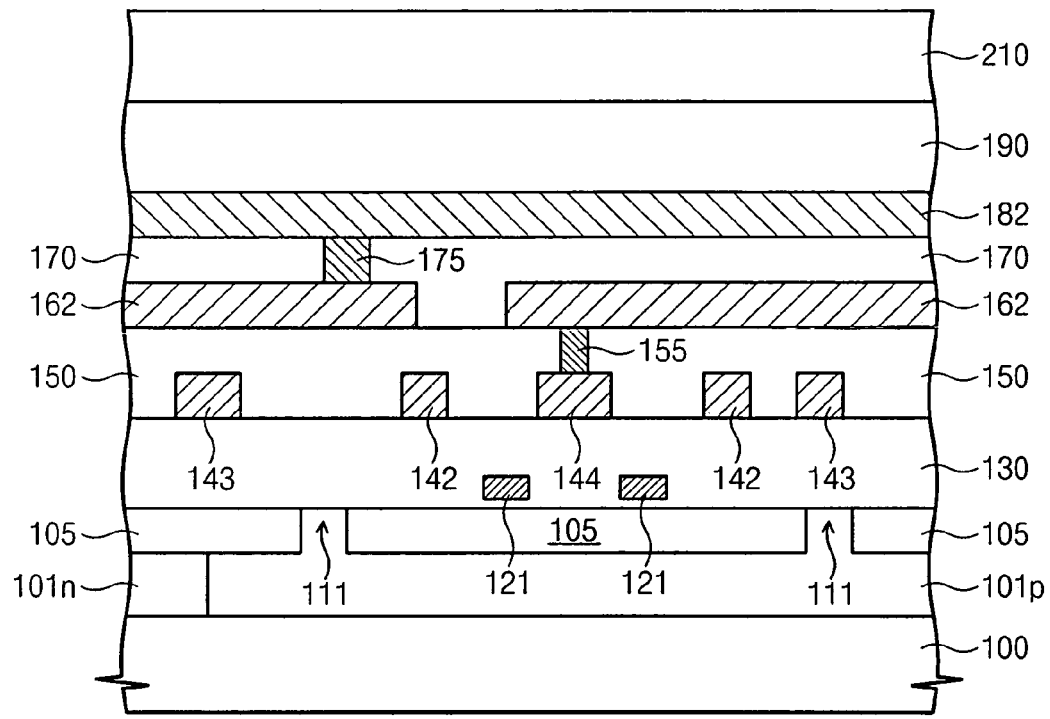
Figure 5C:
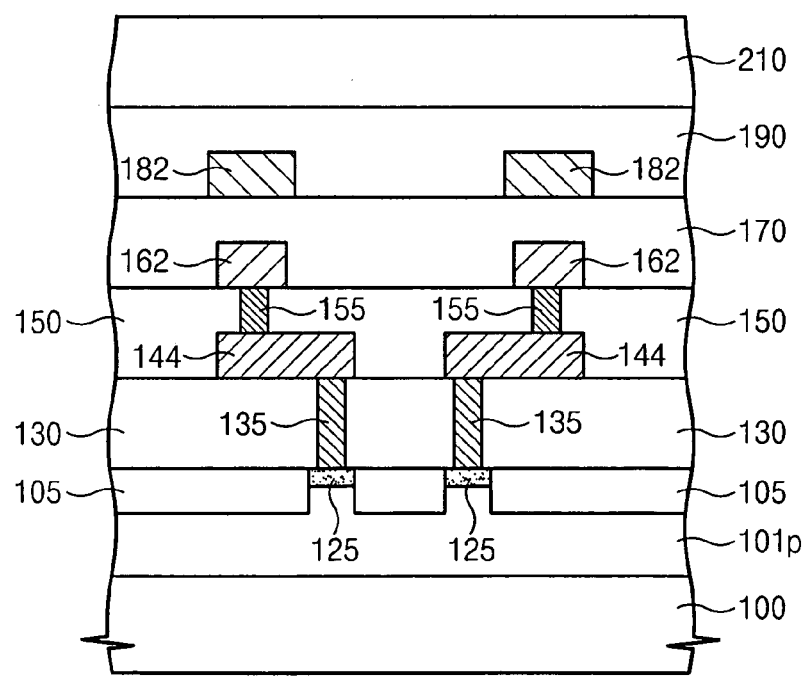

FIGS. 5A, 5B, and 5C illustrate the configurations of the second analytic field 22 being comprised of a modified bitline structure of the full-CMOS SRAM cell array. Referring to FIGS. 5A, 5B, and 5C, the second metal patterns 162 disposed on the second analytic field 22 form landing pads (hereinafter, referred to as "second pads") 162 that are connected to one of the impurity regions 125 by way of the first via plugs 155, the first pads 144, and the contact plugs 135. As such, the second pads 162 are different than the second metal patterns 161 of the first analytic field 21, which connect pluralities of the impurity regions 125, in that they are connected to one of the impurity regions 125.

Meanwhile, the third metal patterns 182 in the second analytic field 22 form bitlines that connect the second pads 162 to each other in a lengthwise direction. In order to complete these connections, the third metal patterns 182 connect to pluralities of the second via plugs 175 that are in turn connected to the second pads 162, penetrating the third interlevel insulation film 170.

According to this embodiment by the invention, the second pads 162 and the first via plugs 155 are formed with large processing margins, while the third metal patterns 182 and the second via plugs 175 in the second analytic field 22 are formed with normal processing margins (see FIG. 9B). For increasing the processing margins in forming the second pads 162, the second pads 162 may be formed in a structure of long landing metals with large surface areas as shown in FIGS. 5A and 5B. In addition, for increasing the processing margins in forming the first via plugs 155, the width of the first via plugs 155 can be extended up to a dimension that is known to prevent defects in the processes of patterning and metal fill. In this case, referring to the aforementioned theory in respect to the relation between the processing margin and the probability of defect generation, it is highly probable that any defects that occur in the second analytic field 22 are generated during the process of forming the third metal patterns, the second via holes, or the second via plugs.

Figure 6A:
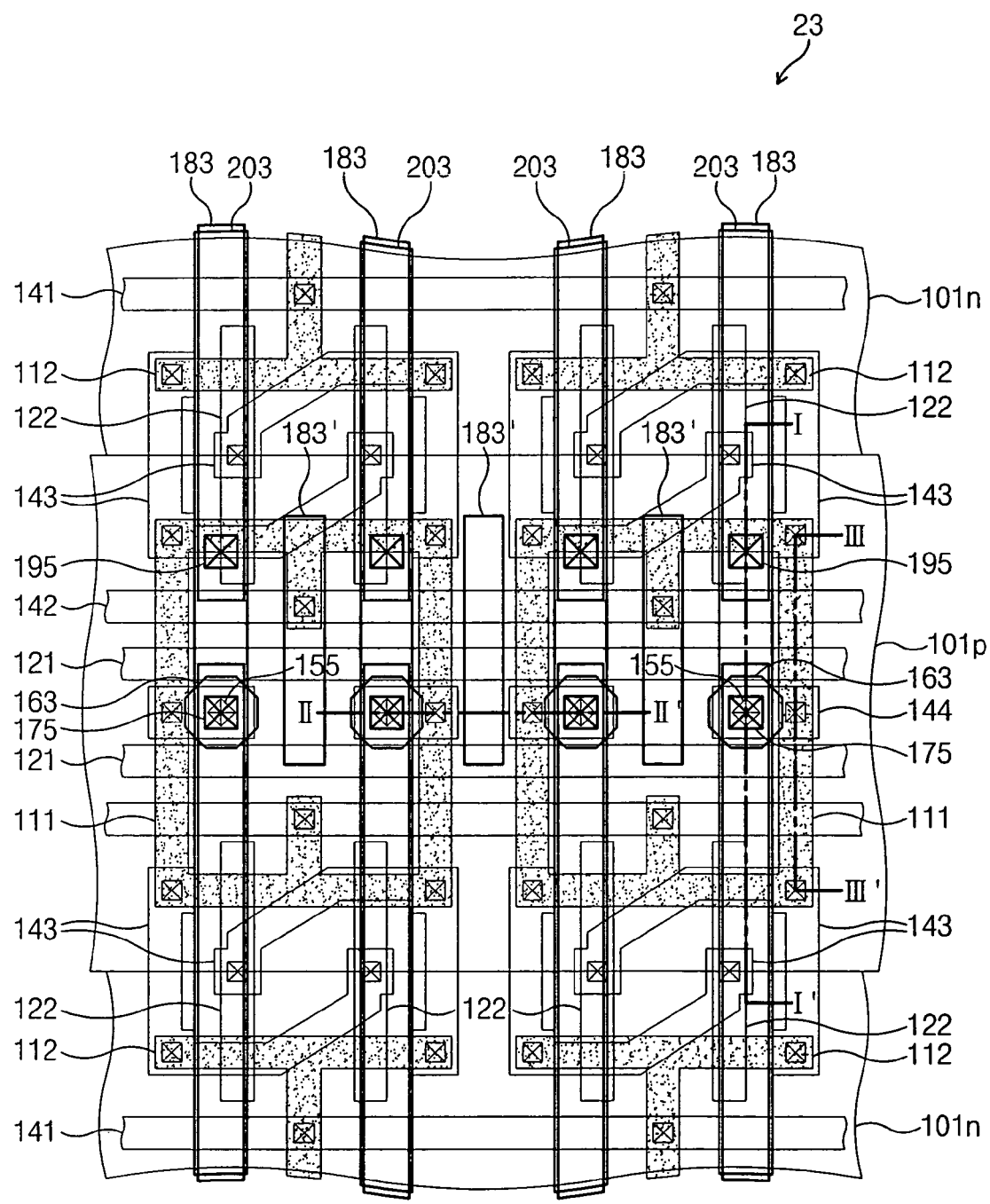
Figure 6B:
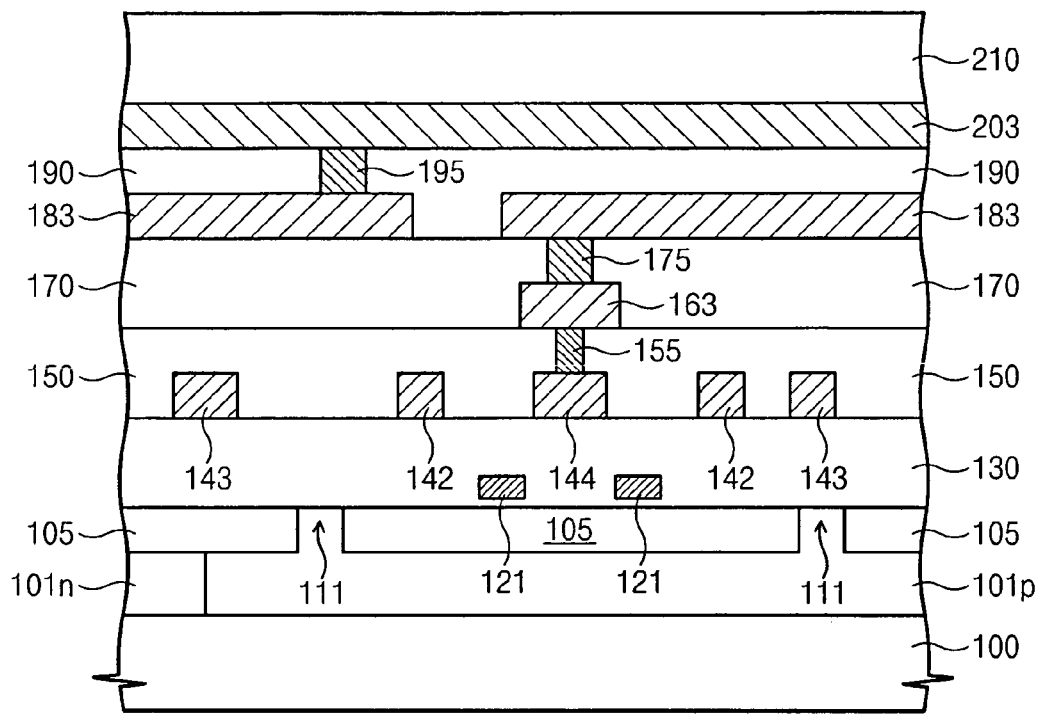
Figure 6C:
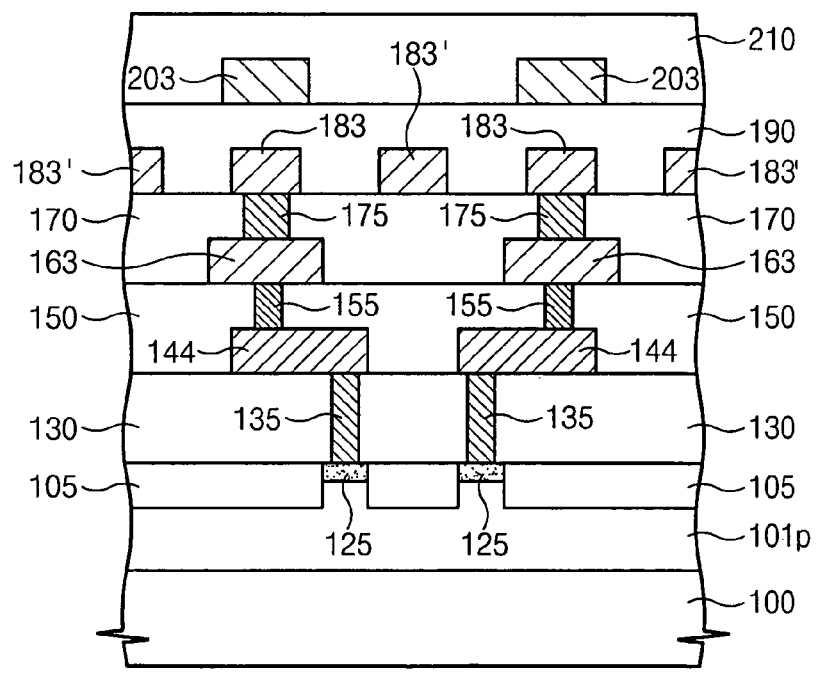

FIGS. 6A, 6B, and 6C illustrate the configurations of the third analytic field 23 being comprised of a modified bitline structure of the full-CMOS SRAM cell array. Referring to FIGS. 6A, 6B, and 6C, the second and third metal patterns, 163 and 183, disposed on the third analytic field 23 are used for landing pads. Namely, the second metal patterns 163 in the third analytic field 23 form landing pads (hereinafter, referred to as "second pads") that are connected to one of the impurity regions 125 by way of the first via plugs 155, the first pads 144, and the contact plugs 135. Further, the third metal patterns 183 in the third analytic field 23 form landing pads (hereinafter, referred to as "third pads") that are connected to one of the impurity regions 125 by way of the second via plugs 175, the second pads 163, the first via plugs 155, the first pads 144, and the contact plugs 135. Here, the third pads 183 may be formed in the structure of long landing metals in the same manner as the second pads 162 of the second analytic field 22.

Meanwhile, the fourth metal patterns 203 in the third analytic field 23 form bitlines that connect the third pads 183 to each other lengthwise. In order to complete these connections, the fourth metal patterns 203 are lead to pluralities of the third via plugs 195 that are connected to the third pads 183, penetrating the fourth interlevel insulation film 190.

According to this embodiment by the invention, the first through third pads, 144, 163, and 183, and the first and second via plugs, 155 and 175, are formed using relatively large processing margins, while the fourth metal patterns 203 and the third via plugs 195 in the third analytic field 23 are formed using normal processing margins (see FIG. 9C). In this case, referring to the aforementioned theory in respect to the relation between the processing margin and the probability of defect generation, it is highly probable that any defects that occur in the third analytic field 23 are generated during the process of forming the fourth metal patterns, the third via holes, or the third via plugs.

Figure 7A:
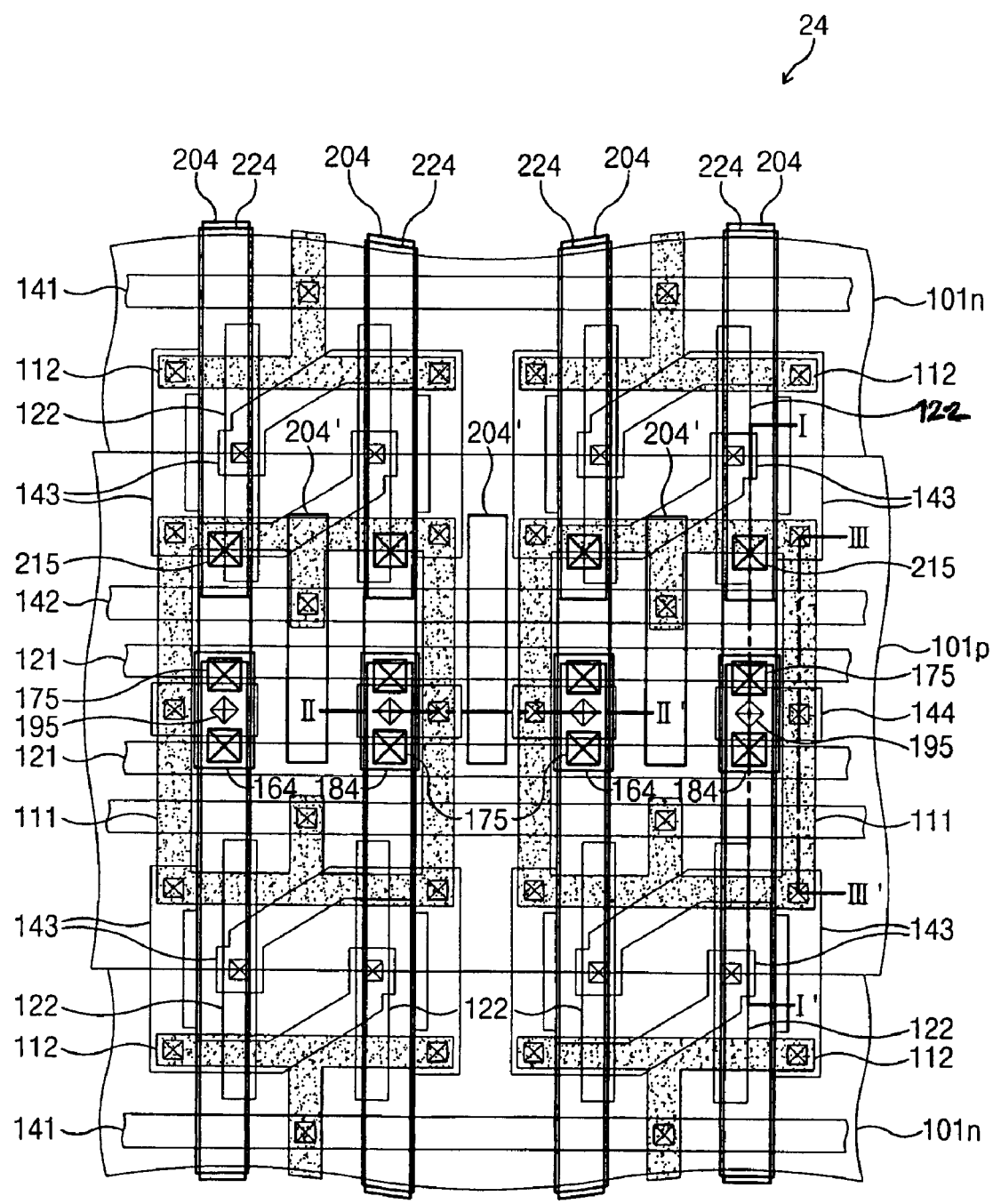
Figure 7B:
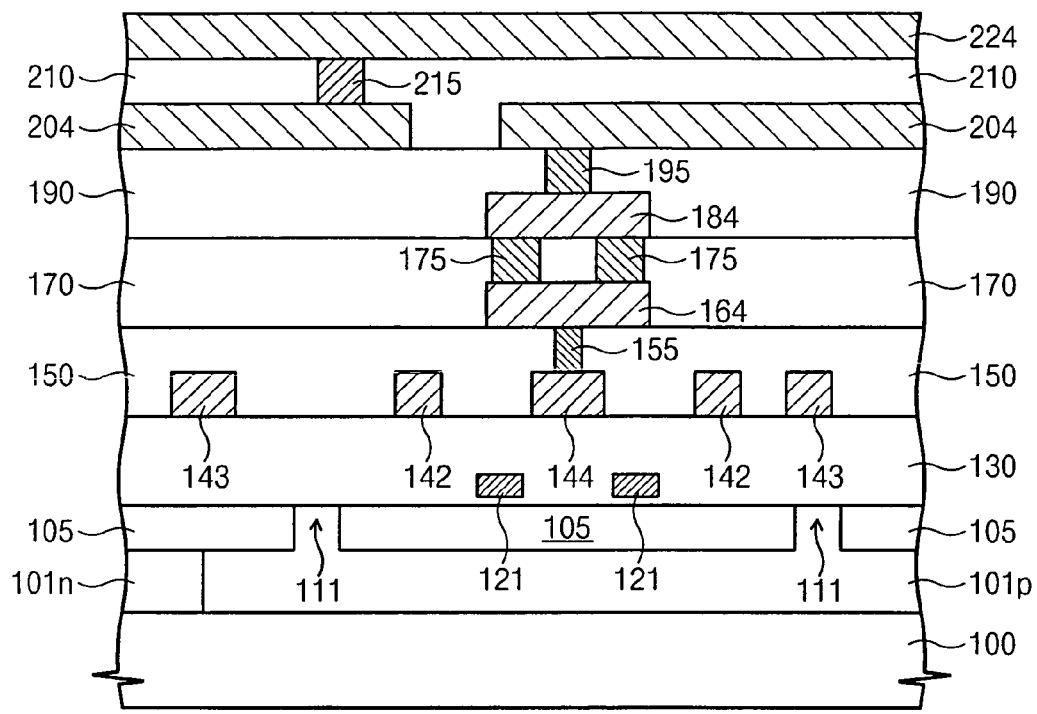
Figure 7C:
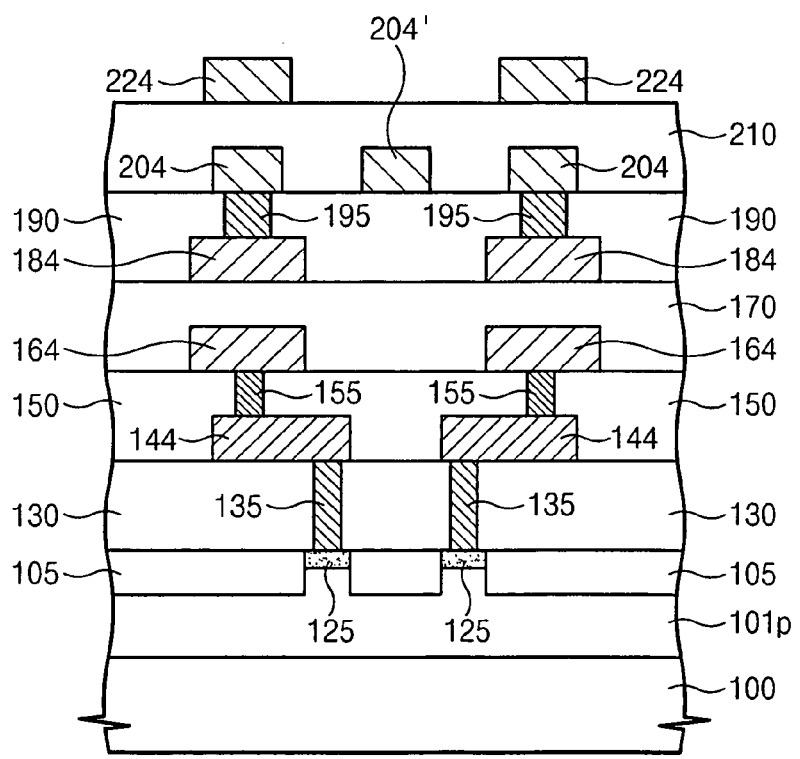

FIGS. 7A, 7B, and 7C illustrate the configurations of the fourth analytic field 24 being comprised of a modified bitline structure of the full-CMOS SRAM cell array. Referring to FIGS. 7A, 7B, and 7C, the second, third and fourth metal patterns, 164, 184 and 204, disposed on the fourth analytic field 24 are used for landing pads. Namely, the second metal patterns 164 in the fourth analytic field 24 form landing pads (hereinafter, referred to as "second pads") that are connected to one of the impurity regions 125 by way of the first via plugs 155, the first pads 144, and the contact plugs 135. Further, the third metal patterns 184 in the fourth analytic field 24 form landing pads (hereinafter, referred to as "third pads") that are connected to one of the second pads 164 by way of the second via plugs 175. The fourth metal patterns 204 in the fourth analytic field 24 form landing pads (hereinafter, referred to as "fourth pads") that are connected to one of the third pads 184 by way of the third via plugs 195.

Here, at least one among the first through fourth pads, 144, 164, 184, or 204, may be formed in the structure of long landing metals in the same manner as the second pads 162 of the second analytic field 22. In addition, the first through third via plugs, 155, 175, and 195, can be constructed in a stacked-via or multi-via structure. The stacked-via structure is configured such that an upper via plug (e.g., the second via plug 175) is vertically located on a lower via plug (e.g., the first via plug 155). The multi-via structure is configured such that pluralities of via plugs are formed on a single landing pad. If the landing pad is enlarged in area, it is easy for the multi-via structure to be accomplished therein, providing a way to reduce the probability of failure in the via-forming process. In other words, the multiple-via structure is advantageous for increasing the processing margins in forming via plugs.

Meanwhile, the fifth metal patterns 224 in the fourth analytic field 24 form bitlines that connect the fourth pads 204 to each other in a lengthwise direction. In order to complete these connections, the fifth metal patterns 224 are lead to pluralities of the fourth via plugs 215 that are connected to the fourth pads 204, penetrating the fifth interlevel insulation film 210.

According to this embodiment by the invention, the first through fourth pads, 144, 164, 184, and 204, and the first through via plugs, 155, 175, and 195, are formed with large processing margins, while the fifth metal patterns 224 and the fourth via plugs 215 in the fourth analytic field 24 are formed with normal processing margins (see FIG. 9D). In this case, referring to the aforementioned theory in respect to the relation between the processing margin and the probability of defect generation, it is highly probable that any defects that occur in the fourth analytic field 24 are generated during the process of forming the fifth metal patterns, the fourth via holes, or the fourth via plugs.

Figure 10:
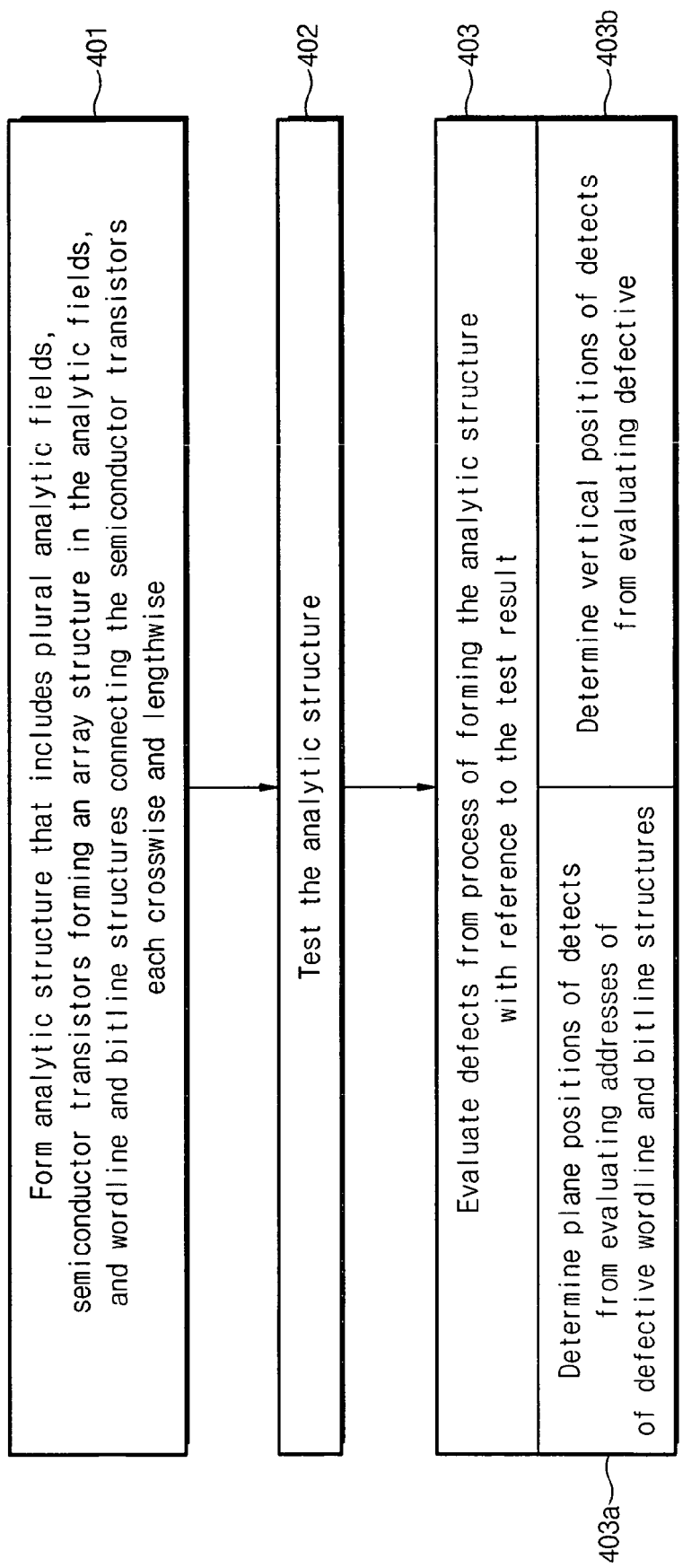
FIG. 10 is a flow chart showing a procedure of analyzing failure in accordance with an embodiment of the invention.

In summary, interconnection structures with different heights and configurations are each formed in the first, second, third, and fourth analytic fields 21, 22, 23, and 24. The interconnection structures in each analytic field are formed with different heights and configurations so as to evaluate metal layers of the structures along vertical heights. In each field, predetermined metal layers are formed with normal or less-than-normal processing margins, while the remaining elements are formed with relatively large processing margins. Accordingly, since the probability of defect generation that arises due to the process of forming metal layers can be confined in this manner, it is possible to readily determine the vertical position of a defect (refer to step 403b of FIG. 10).

A plane position of a defect is also readily obtained, in this case from an address where the defect is generated. The address of defect can be readily determined out by detecting the locations of the wordline and bitline where the defect is generated in each analytic field (refer to step 403a of FIG. 10). For instance, with connecting a predetermined memory test system to wordlines and bitlines in order to conduct a memory test operation, a failure map may be composed to identify the plane positions of defects. If the addresses of defective positions are known, the semiconductor substrate can be cut at correct positions by means of focused ion beam (FIB). In this case, it is possible to minimize the factors that cause failure in locating and analyzing defects because of damage to a sample wafer having the small number of defects.

Moreover, according to the embodiment of the invention, as cell arrays positioned in the analytic fields 21, 22, 23, and 24 are composed of full-CMOS SRAM cell transistors, it is possible to estimate the pattern of a defect from the unique structure of the SRAM cell array. In other words, when the failure map denotes all of cells connected to a wordline have failed, a conclusion can be reached that there is a defect (e.g., short-circuit) in the first gate patterns 121. Further, when there are defects on the contact plugs 155, the active regions 111 and 112, and the second gate patterns 122, such defects identify themselves as 1-bit patterns randomly positioned on the failure map.

According to the aforementioned embodiment of the invention, the first pads 144 are shared by two adjacent SRAM cells. Thus, when bitlines are not connected to the impurity regions 125 in the analytic fields 21, 22, 23, and 24, defects are generated in the patterns of 2-bit column in which the two adjacent cells have the defects together. For instance, the 2-bit column defect is generated at a location in the third analytic field 23, it is possible to conclude that the defect may have occurred in the third via plugs 175. Since the third analytic field 23 is provided with a regulated processing margin to evaluate defects arising from the third via plugs 175 and the fourth metal patterns 183, it is possible to conclude that the defects on the third analytic field 23 may have occurred in the third via plugs 175 or the fourth metal patterns 183. In this case, if there is a 2-bit column defect as aforementioned, it is possible to conclude that the defect may have occurred in the interconnection structure (i.e., the third via plugs 14) connecting the bitline (i.e., the fourth metal patterns 183) to the impurity regions 125. In order to verify the presence of defects, optical information about plane positions of sections containing defects is required. Such optical information related to the positions of sections to be taken can be readily obtained from the array addresses.

Considering that it is difficult to determine a vertical position of a defect when the interconnection structure has a large number of layers therein, the structure and method for failure analysis in accordance with the invention is efficient in evaluating defects of the interconnection structure in a semiconductor device with plural layers of metal patterns, such as a central processor unit. Variations in the processing margins and the structures of the analytic structures can further assist in such failure analysis.

According to the invention, topological (i.e., plane and vertical) positions of defects arising from a semiconductor device with multi-level interconnections can be readily determined. Thus, it is possible to perform a quick and accurate analysis for interconnection defects. As a result, development time of a semiconductor device can be shortened.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. An analytic structure for semiconductor failure analysis, comprising:
 a plurality of analytic fields disposed on a predetermined area of a semiconductor device;
 semiconductor transistors arranged in each of the analytic fields, the semiconductor transistors arranged in an array;
 wordlines arranged on each of the plurality of the analytic fields, connecting the semiconductor transistors with each other in a first direction; and
 bitline structures on each of the plurality of the analytic fields, connecting the semiconductor transistors with each other in a second direction,
 wherein first and second analytic fields of the plurality of analytic fields each has a first layer comprising a first bitline structure, and wherein the second analytic field has a second layer comprising a second bitline structure conductively coupled to the first bitline structure of the first layer of the second analytic field, and wherein the first bitline structure of the second analytic field is configured in a different pattern than the first bitline structure of the first analytic field.

2. The analytic structure as set forth in claim 1, wherein the semiconductor transistors constitute an SRAM cell array including two load transistors, two drive transistors, and two pass transistors.

3. The analytic structure as set forth in claim 2, wherein the wordlines connect gate electrodes of the pass transistors with each other in a first direction,
 wherein the bitline structures connect drain regions of the pass transistors with each other in a second direction.

4. The analytic structure as set forth in claim 1, wherein the bitline structures at least comprise metal patterns of a single layer and plugs of a single layer.

5. The analytic structure as set forth in claim 4, wherein the metal patterns and plugs of the bitline structures are formed in a number of layers that is different in each of the plurality of analytic fields.

6. The analytic structure as set forth in claim 4, wherein the metal patterns and plugs of the bitline structures are formed in a configuration that is different in each of the plurality of analytic fields.

7. An analytic structure for semiconductor failure analysis, comprising:
 analytic fields disposed on a predetermined area of a semiconductor device, at least including first, second, third, and fourth analytic fields;
 semiconductor transistors arranged in each of the analytic fields, the semiconductor transistors arranged in an array;
 wordlines arranged on each of the plurality of analytic fields, connecting the semiconductor transistors with each other in a first direction; and
 bitline structures on each of the plurality of analytic fields, connecting the semiconductor transistors with each other in a second direction,
 wherein the first and second analytic fields of the plurality of analytic fields each has a first layer comprising a first bitline structure that comprises metal patterns and plugs, and wherein the second analytic field has a second layer comprising a second bitline structure that comprises metal patterns and plugs and is conductively coupled to the first bitline structure of the first layer of the second analytic field, and wherein the metal patterns and plugs of the first bitline structure of the second analytic field are configured in a different pattern and have different interconnection features than the first bitline structure of the first analytic field.

8. The analytic structure as set forth in claim 7, wherein the semiconductor transistors constitute an SRAM cell array including two load transistors, two drive transistors, and two pass transistors.

9. The analytic structure as set forth in claim 8, wherein the wordlines connect gate electrodes of the pass transistors with each other in the first direction, wherein the bitline structures connect drain regions of the pass transistors with each other in the second direction.

10. The analytic structure as set forth in claim 7, wherein the bitline structures comprise:
 contact plugs connected to drain regions of the semiconductor transistors;
 first metal patterns contacting to the contact plugs;
 first via plugs contacting to the first metal patterns; and
 second metal patterns contacting to the first via plugs, wherein the first metal patterns are pads electrically connected to one of the contact plugs.

11. The analytic structure as set forth in claim 10, wherein the second metal patterns connect the first via plugs with each other in the second direction in the first analytic field, and are disposed to be electrically connected to one of the drain regions through one of the via plugs in a remainder of the analytic fields including the second through fourth fields.

12. The analytic structure as set forth in claim 10, wherein the bitline structures further comprise:
   second via plugs connected to the second metal patterns in a remainder of the analytic fields except the first field;
   third metal patterns connected to the second via plugs;
   third via plugs connected to the third metal patterns in the remainder of the analytic fields except the first and second fields;
   fourth metal patterns connected to the third via plugs;
   fourth via plugs connected to the fourth metal patterns in the remainder of the analytic fields except the first through third fields; and
   fifth metal patterns connected to the fourth via plugs,
   wherein the third metal patterns connect the second via plugs with each other in the second direction in the second field, and are disposed to be electrically connected to one of the drain regions through the second via plugs in the remainder of the analytic fields including the third and fourth fields,
   wherein the fourth metal patterns connect the third via plugs with each other in the second direction in the third field, and are disposed to be electrically connected to one of the drain regions through the third via plugs in the remainder of the analytic fields including the fourth fields,
   wherein the fifth metal patterns connect the second via plugs with each other in the second direction in the fourth field.

13. The analytic structure as set forth in claim 12, wherein the third metal patterns are larger than the first metal patterns in area in the remainder of the analytic fields except the first and second fields.

14. The analytic structure as set forth in claim 12, wherein the third via plugs are positioned vertically on the second via plugs to form a stacked via structure in the remainder of the analytic fields except the first and second fields.

15. The analytic structure as set forth in claim 12, wherein the third via plugs are positioned on the third metal pattern in plurality to form a multi-via structure in the remainder of the analytic fields except the first and second fields.

16. The analytic structure as set forth in claim 12, wherein the fourth metal patterns are larger than the first metal patterns in area in the remainder of the analytic fields except the first through third fields.

17. The analytic structure as set forth in claim 12, wherein the fourth via plugs are positioned vertically on the second or third via plugs to form a stacked via structure in the remainder of the analytic fields except the first through third fields.

18. The analytic structure as set forth in claim 12, wherein the fourth via plugs are positioned on the fourth metal pattern in plurality to form a multi-via structure in the remainder of the analytic fields except the first through third fields.

19. An analytic structure for semiconductor failure analysis, comprising:
   analytic fields disposed on a predetermined area of a semiconductor device, at least including first, second, third, and fourth analytic fields;
   semiconductor transistors arranged in each of the analytic fields, the semiconductor transistors arranged in an array;
   wordlines arranged on each of the plurality of analytic fields, connecting the semiconductor transistors with each other in a first direction; and
   bitline structures on each of the plurality of analytic fields, connecting the semiconductor transistors with each other in a second direction,
   wherein the bitline structures comprises metal patterns and plugs that are different in a number of layers and in interconnection features in each of the plurality of the analytic fields, and wherein the bitline structures comprise:
   contact plugs connected to drain regions of the semiconductor transistors;
   first metal patterns contacting to the contact plugs;
   first via plugs contacting to the first metal patterns; and
   second metal patterns contacting to the first via plugs,
   wherein the first metal patterns are pads electrically connected to one of the contact plugs.

20. The analytic structure as set forth in claim 19, wherein the second metal patterns connect the first via plugs with each other in the second direction in the first analytic field, and are disposed to be electrically connected to one of the drain regions through one of the via plugs in a remainder of the analytic fields including the second through fourth fields.

21. The analytic structure as set forth in claim 19, wherein the bitline structures further comprise:
   second via plugs connected to the second metal patterns in a remainder of the analytic fields except the first field;
   third metal patterns connected to the second via plugs;
   third via plugs connected to the third metal patterns in the remainder of the analytic fields except the first and second fields;
   fourth metal patterns connected to the third via plugs;
   fourth via plugs connected to the fourth metal patterns in the remainder of the analytic fields except the first through third fields; and
   fifth metal patterns connected to the fourth via plugs,
   wherein the third metal patterns connect the second via plugs with each other in the second direction in the second field, and are disposed to be electrically connected to one of the drain regions through the second via plugs in the remainder of the analytic fields including the third and fourth fields,
   wherein the fourth metal patterns connect the third via plugs with each other in the second direction in the third field, and are disposed to be electrically connected to one of the drain regions through the third via plugs in the remainder of the analytic fields including the fourth fields,
   wherein the fifth metal patterns connect the second via plugs with each other in the second direction in the fourth field.

22. The analytic structure as set forth in claim 21, wherein the third metal patterns are larger than the first metal patterns in area in the remainder of the analytic fields except the first and second fields.

23. The analytic structure as set forth in claim 21, wherein the third via plugs are positioned vertically on the second via plugs to form a stacked via structure in the remainder of the analytic fields except the first and second fields.

24. The analytic structure as set forth in claim 21, wherein the third via plugs are positioned on the third metal pattern in plurality to form a multi-via structure in the remainder of the analytic fields except the first and second fields.

25. The analytic structure as set forth in claim 21, wherein the fourth metal patterns are larger than the first metal patterns in area in the remainder of the analytic fields except the first through third fields.

26. The analytic structure as set forth in claim 21, wherein the fourth via plugs are positioned vertically on the second or third via plugs to form a stacked via structure in the remainder of the analytic fields except the first through third fields.

27. The analytic structure as set forth in claim 21, wherein the fourth via plugs are positioned on the fourth metal pattern in plurality to form a multi-via structure in the remainder of the analytic fields except the first through third fields.

* * * * *